United States Patent
Mizoshiri et al.

(10) Patent No.: US 12,542,521 B2
(45) Date of Patent: Feb. 3, 2026

(54) Class-D AMPLIFIER, A METHOD OF GENERATING A CARRIER WAVE SIGNAL IN A class-D AMPLIFIER

(71) Applicant: YAMAHA CORPORATION, Hamamatsu (JP)

(72) Inventors: Shinya Mizoshiri, Hamamatsu (JP); Masao Noro, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 967 days.

(21) Appl. No.: 17/706,038

(22) Filed: Mar. 28, 2022

(65) Prior Publication Data
US 2022/0216835 A1 Jul. 7, 2022

Related U.S. Application Data

(63) Continuation of application No. PCT/JP2020/037041, filed on Sep. 30, 2020.

(30) Foreign Application Priority Data

Sep. 30, 2019 (JP) .................. 2019-180512

(51) Int. Cl.
*H03F 3/217* (2006.01)
*H03K 7/08* (2006.01)

(52) U.S. Cl.
CPC ............... *H03F 3/217* (2013.01); *H03K 7/08* (2013.01); *H03F 2200/03* (2013.01); *H03F 2200/351* (2013.01)

(58) Field of Classification Search
CPC .................. H03F 3/217; H03F 2200/03; H03F 2200/351; H03F 1/34; H03F 3/183; H03F 3/2173; H03F 3/2175; H03K 7/08
(Continued)

(56) References Cited

U.S. PATENT DOCUMENTS

| 4,823,056 A | 4/1989 | Watanabe |
| 2010/0244958 A1 | 9/2010 | Tsuji |

(Continued)

FOREIGN PATENT DOCUMENTS

| JP | S626525 A | 1/1987 |
| JP | 2010226641 A | 10/2010 |

(Continued)

OTHER PUBLICATIONS

English translation of Written Opinion issued in Intl. Appln. No. PCT/JP2020/037041 mailed Oct. 27, 2020, previously cited in IDS filed Mar. 28, 2022.

(Continued)

*Primary Examiner* — Andrea Lindgren Baltzell
*Assistant Examiner* — Jose E Pinero
(74) *Attorney, Agent, or Firm* — ROSSI, KIMMS & McDOWELL LLP

(57) ABSTRACT

Pulse width modulators 131P and 131N respectively generate a first pulse Vp whose pulse width changes according to an input signal Vin based on the input signal Vin and a generated first carrier wave C1P, and a second pulse Vn whose pulse width changes according to the input signal Vin based on the input signal Vin and a generated second carrier wave C1N. Wherein due to the non-liner gradient in each of the generated first carrier wave C1P and the generated second carrier wave C1N and, duty ratio of each of the generated first pulse Vp and the generated second pulse Vn is less than 50% in a state where a value of the input signal is zero; and a difference between a pulse width of the first pulse Vp and a pulse width of the second pulse Vn linearly changes according to the input signal Vin.

16 Claims, 7 Drawing Sheets

(58) Field of Classification Search
USPC .......................................................... 330/160
See application file for complete search history.

(56) References Cited

U.S. PATENT DOCUMENTS

| | | |
|---|---|---|
| 2010/0321570 A1* | 12/2010 | Odagiri ................. H03F 3/2171 |
| | | 348/E5.009 |
| 2012/0105155 A1 | 5/2012 | Odagiri |
| 2015/0054553 A1 | 2/2015 | Odagiri |
| 2017/0234950 A1 | 8/2017 | Lenz |
| 2019/0007011 A1 | 1/2019 | Berkhout |

FOREIGN PATENT DOCUMENTS

| | | |
|---|---|---|
| JP | 2011004328 A | 1/2011 |
| JP | 2018137548 A | 8/2018 |

OTHER PUBLICATIONS

International Preliminary Report on Patentability issued in Intl. Appln. No. PCT/JP2020/037041 mailed Apr. 14, 2022. English translation provided.
International Search Report issued in Intl. Appln. No. PCT/JP2020/037041 mailed Oct. 27, 2020. English translation provided.
Written Opinion issued in Intl. Appln. No. PCT/JP2020/037041 mailed Oct. 27, 2020.

* cited by examiner

Class-D AMPLIFIER, A METHOD OF GENERATING A CARRIER WAVE SIGNAL IN A class-D AMPLIFIER

CROSS REFERENCE TO RELATED APPLICATIONS

The present application is a continuation application of International Application No. PCT/JP2020/037041, filed Sep. 30, 2020, which claims a priority to Japanese Patent Application No. 2019-180512, filed Sep. 30, 2019. The contents of these applications are incorporated herein by reference in their entirety.

TECHNICAL FIELD

The present application relates to a class-D amplifier and a method of generating a carrier wave signal in a class-D amplifier for driving a load with a pulse that is pulse-width modulated based on an input signal.

BACKGROUND INFORMATION

A class-D amplifier is known that generates a first pulse whose pulse width increases in response to a change in an input signal in a positive direction and a second pulse whose pulse width increases in response to a change in the input signal in a negative direction, and drives a load such as a speaker with the first and second pulses.

In a filterless class-D amplifier among class-D amplifiers of this type, in a small signal region in which the level of an input signal is close to zero, the range of the input signal from which the first pulse is output and the range of the input signal from which the second pulse is output overlap each other.

In the small signal region, the input signal is falls between the lower limit of the input signal for generating the first pulse and the upper limit of the input signal for generating the second pulse. For this reason, in the small signal region, both the pulse width of the first pulse and the pulse width of the second pulse are short. Therefore, the power consumption in the small signal region is reduced.

CITATION LIST

Patent Literature

Patent Literature 1: JP 2018-137548A

SUMMARY

In the above-described conventional class-D amplifier, in the small signal region, a first pulse whose pulse width increases and a second pulse whose pulse width decreases in accordance with, for example, a change in the positive direction of the input signal are output. For this reason, the open loop gain (inclination of input/output characteristic) of the class-D amplifier is different between the small signal region and the region other than the small signal region, and there is the problem of the total harmonic distortion factor increasing.

A technique for preventing distortion of an output signal of a class-D amplifier is disclosed in, for example, Patent Document 1. In the technique disclosed in Patent Document 1, an offset voltage that generates distortion that cancels distortion generated by an output stage in a class-D amplifier is applied to an input signal of a pulse width modulator of the class-D amplifier.

However, even if such offset adjustment is performed, the voltage difference between the input signal (input signal to which the offset voltage is added) supplied to the pulse width modulator of the class-D amplifier and the carrier wave changes, and the pulse width of each pulse output from the pulse width modulator is only uniformly corrected. In the conventional class-D amplifier described above, because the open loop gain in the small signal region is different from the open loop gain in the other regions, distortion occurs. For this reason, even if the offset is adjusted, the occurrence of distortion in the class-D amplifier is not suppressed.

The present disclosure has been made in view of the above-described circumstances, and an object is to reduce power consumption in a small signal region while suppressing an increase in the total harmonic distortion factor of a class-D amplifier.

The present disclosure provides a class-D amplifier including: first and second carrier wave generators configured to respectively generate a first carrier wave and a second carrier wave, each of the generated first and second carrier waves being a periodic signal including a rising portion and a falling portion; and first and second pulse width modulators configured to respectively generate: a first pulse whose pulse width changes in accordance with an input signal, based on the input signal and the generated first carrier wave; and a second pulse whose pulse width changes in accordance with the input signal, based on the input signal and the generated second carrier wave, wherein each of the generated first and second carrier waves includes a non-linear gradient in at least one of the rising portion or the falling portion, and
wherein due to the non-liner gradient in each of the generated first and second carrier waves: a duty ratio of each of the generated first and second pulses is less than 50% in a state where a value of the input signal is zero; and a difference between a pulse width of the first pulse and a pulse width of the second pulse linearly changes according to the input signal.

Also, the present disclosure provides a class-D amplifier including: a first modulator configured to generate a first pulse whose pulse width increases as a value of an input signal increases; and a second modulator configured to generate a second pulse whose pulse width increases as the value of the input signal decreases, wherein a duty ratio of each of the generated first and second pulses is less than 50% in a state where the value of the input signal is zero, and wherein a difference between the pulse width of the generated first pulse and the pulse width of the generated second pulse changes linearly according to the input signal, and wherein, as the value of the input signal increases, a change in the pulse width of the generated first pulse with respect to a change in the value of the input signal increases, and wherein as the value of the input signal decreases, a change in the pulse width of the generated second pulse with respect to the change in the value of the input signal decreases.

Also, the present disclosure provides a method of generating a carrier wave signal in a class-D amplifier, the method comprising: generating a first carrier wave and a second carrier wave, each of the generated first and second carrier waves being a periodic signal including a rising portion and a falling portion; and generating a first pulse whose pulse width changes in accordance with an input signal, based on the input signal and the generated first carrier wave; and generating a second pulse whose pulse width changes in accordance with the input signal, based on the input signal and the generated second carrier wave, wherein each of the generated first and second carrier waves includes a non-linear gradient in at least one of the rising portion or the falling portion, and wherein due to the non-liner gradient in each of the generated first and second carrier waves: a duty ratio of each of the generated first and second pulses is less than 50% in a state where a value of the input signal is zero; and a difference between a pulse width of the first pulse and a pulse width of the second pulse linearly changes according to the input signal.

DESCRIPTION OF EMBODIMENTS

Hereinafter, embodiments will be described with reference to the drawings.

First Embodiment

Figure 1:
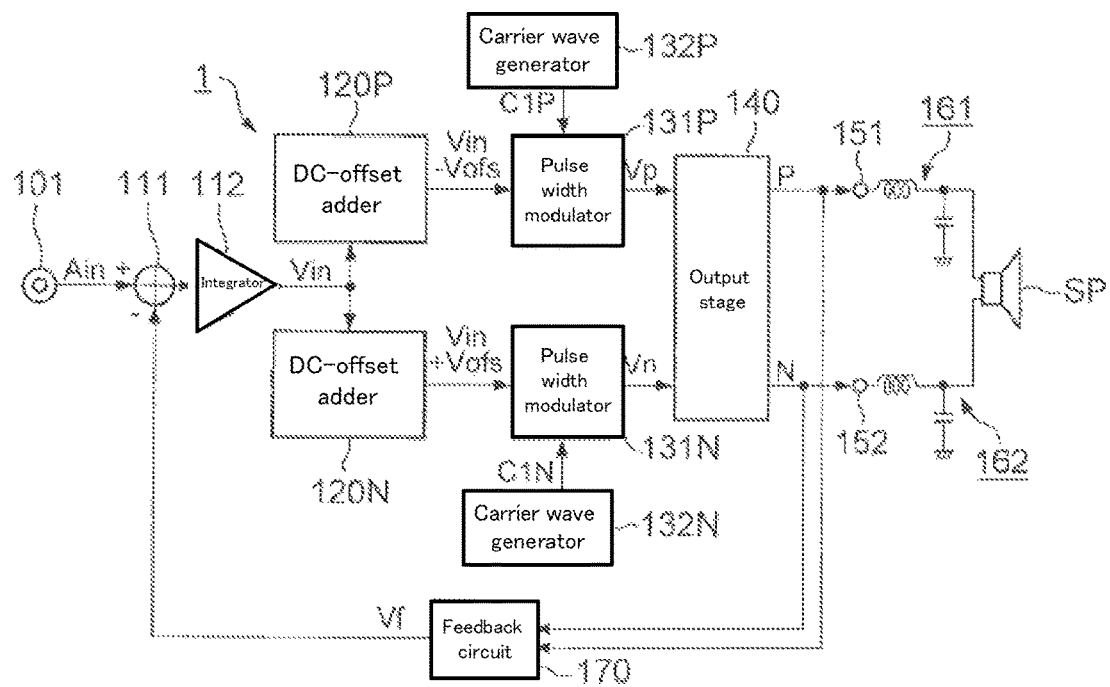
FIG. 1 is a block diagram illustrating a configuration of a class-D amplifier according to a first embodiment.

FIG. 1 is a block diagram of a class-D amplifier 1 according to a first embodiment. In FIG. 1, LC filters 161 and 162 and a speaker SP serving as a load are shown together with the class-D amplifier 1 to facilitate understanding of the configuration of the class-D amplifier 1. The LC filters 161 and 162 are respectively connected to terminals 151 and 152 of the class-D amplifier 1. The speaker SP is connected between the LC filters 161 and 162. The LC filters 161 and 162 serve to remove high-frequency components of the pulses output from the terminals 151 and 152.

In FIG. 1, a subtractor 111 subtracts a feedback signal Vf output from a feedback circuit 170 from an input audio signal Ain supplied via an input 101, and outputs a signal indicating the subtraction result. An integrator 112 integrates and outputs an output signal of the subtractor 111. The output signal of the integrator 112 is supplied to DC-offset adders 120P and 120N as an input signal Vin. The DC-offset adder 120P outputs, to a pulse width modulator 131P, an input signal Vin−Vofs obtained by adding a negative offset voltage −Vofs to the input signal Vin. The DC-offset adder 120N outputs, to a pulse width modulator 131N, an input signal Vin+Vofs obtained by adding a positive offset voltage +Vofs to the input signal Vin.

Figure 2:
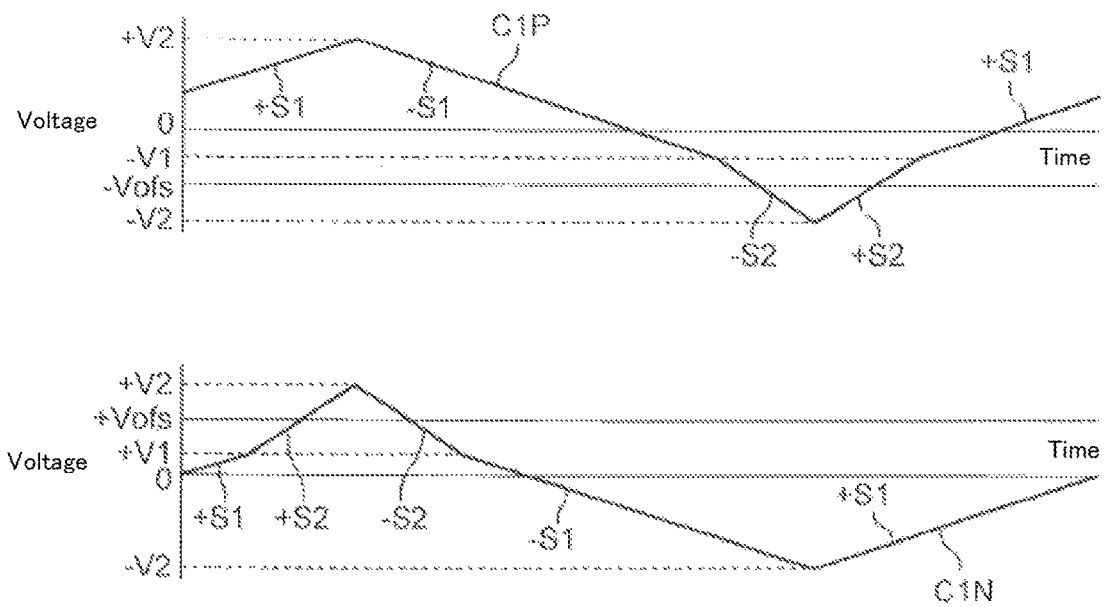
FIG. 2 is a waveform diagram illustrating waveforms of carrier waves in the class-D amplifier.

First and second carrier wave generators 132P and 132N are circuits that respectively generate periodic carrier waves C1P and C1N in which a rising portion or a falling portion are alternately repeated. FIG. 2 shows the carrier waves C1P and C1N. As shown in FIG. 2, each of the carrier waves C1P and C1N has a polygonal line shape in which the gradient changes stepwise in at least one of the rising portion and the falling portion. In each of the carrier waves C1P and C1N of the present embodiment, the gradient changes stepwise in both the rising portion and the falling portion. In the following, the first carrier wave generator 132P is referred to as carrier wave generator 132P and the second carrier wave generator 132N is referred to as carrier wave generator 132N.

The carrier wave C1P repeats a waveform of rising with a positive gradient +S1 (S1 is a positive constant) from a negative predetermined voltage (negative voltage −V1 described later) to a positive voltage +V2, falling with the negative gradient −S1 from the positive voltage +V2 to the negative voltage −V1, falling with a negative gradient −S2 (S2 is a positive constant) from the negative voltage −V1 to the negative voltage −V2, and rising with the positive gradient +S2 from the negative voltage −V2 to the negative voltage −V1. Here, S2 is twice as large as S1. In this description, V1 and V2 are both positive constant voltages, but V1 also be zero or a negative constant voltage.

The carrier wave C1N repeats a waveform of rising with the positive gradient +S1 from a negative predetermined voltage (negative voltage −V2 described later) to the positive voltage +V1, rising with the positive gradient +S2 from the positive voltage +V1 to the positive voltage +V2, falling with the negative gradient −S2 from the positive voltage +V2 to the positive voltage +V1, and falling with the negative gradient −S1 from the positive voltage +V1 to the negative voltage −V2.

The following relationship between the voltages +V1, −V1, +V2, and −V2, which are the change points of the gradients of the carrier waves C1P and C1N, and the above-described offset voltages +Vofs and −Vofs holds true. That is, the positive offset voltage +Vofs is an intermediate voltage (+V1+V2)/2 between the positive voltages +V1 and +V2, and the negative offset voltage −Vofs is an intermediate voltage (−V1−V2)/2 between the negative voltages −V1 and −V2.

Figure 3:
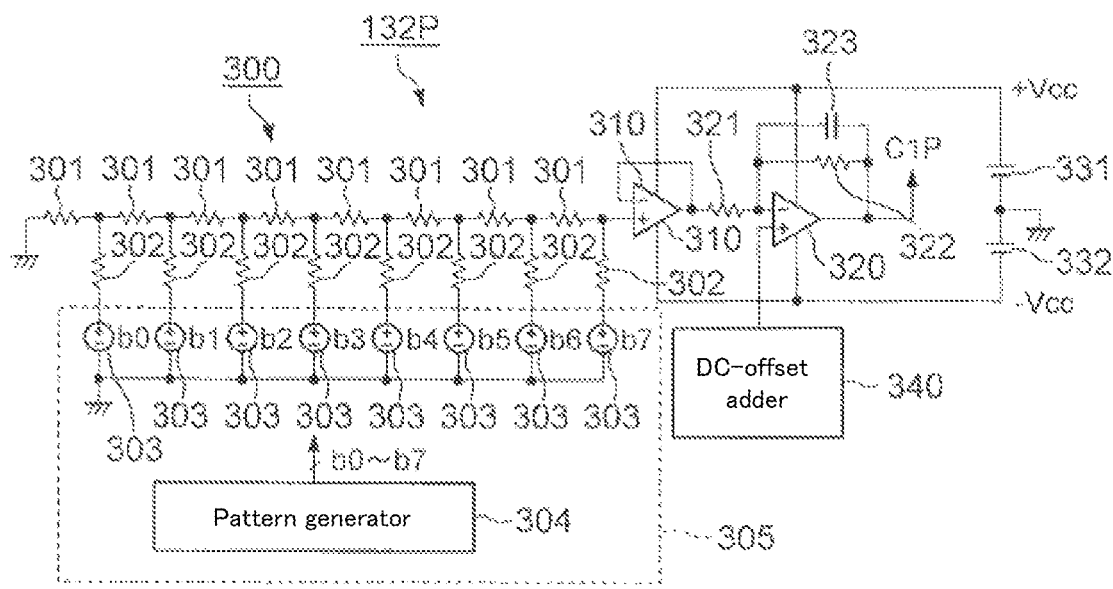
FIG. 3 is a circuit diagram illustrating a configuration example of a carrier wave generator in the class-D amplifier.

FIG. 3 is a circuit example of a carrier wave generator 132P that outputs the carrier wave C1P. In FIG. 3, eight resistors 301 connected in series between a non-inverting input of an operational amplifier 310 and the ground, and eight resistors 302 whose first ends are connected to a connection point between the non-inverting input of the operational amplifier 310 and a resistor 301 and respective connection points between the resistors 301 constitute a well-known R-2R ladder-type DAC (Digital Analogue Converter) 300. That is to say, when the resistance value of the eight resistors 301 is R, the resistance value of the eight resistors 302 is 2R.

A digital signal generator 305 includes eight signal sources 303 respectively connected to second ends of the eight resistors 302, and a pattern generator 304. The pattern generator 304 stores 8-bit sample values of the carrier wave C1P shown in FIG. 2 over one cycle, sequentially reads the sample values of the carrier wave C1P in synchronization with a clock (not shown), and drives the eight signal sources 303 with the bits b0 to b7 of the sample values. The signal source 303 to which the bit "1" is given outputs a predetermined voltage corresponding to one bit, and the signal source 303 to which the bit "0" is given outputs zero volts. The DAC 300 converts the 8 bits b0 to b7 generated by the signal sources 303 as described above into analog signals and outputs the analog signals.

Operational amplifiers 310 and 320 are supplied with a voltage +Vcc supplied from a positive power supply 331 and a voltage −Vcc supplied from a negative power supply 332. The output and the inverting input of the operational amplifier 310 are short-circuited to form a voltage follower. This voltage follower amplifies (impedance-converts) the output signal of the DAC 300 with a gain 1 and outputs the amplified signal.

The output of the operational amplifier 310 is connected to the inverting input of an operational amplifier 320 via a resistor 321. A resistor 322 and a capacitor 323 are connected in parallel between the output and the inverting input of the operational amplifier 320. A capacitor 324 is connected between the non-inverting input of the operational amplifier 320 and the ground. The output voltage of a DC-offset adder 340 is applied to the non-inverting input of the operational amplifier 320.

According to this configuration, the operational amplifier 320 uses the output voltage (voltage different from Vofs) of the DC-offset adder 340 as a neutral point, amplifies the output signal of the operational amplifier 310 with a gain determined by the resistance ratio of the resistors 321 and 322, and outputs the amplified signal as the carrier wave C1P. In this manner, the carrier wave C1P shown in FIG. 2 is output. The operational amplifier 320 shifts the output voltage of the DAC 300 in accordance with the output voltage of the DC-offset adder 340 so that the output voltage of the DAC 300 falls within a voltage range required by a PWM modulator in a subsequent stage. The operational amplifier 320 shifts, for example, the output voltage of the DAC 300 within a range of 0V to a positive predetermined voltage to a voltage within a range from a negative predetermined voltage to a positive predetermined voltage.

The configuration example of the carrier wave generator 132P has been described above. The configuration of the carrier wave generator 132N for generating the carrier wave C1N is also same as that of the carrier wave generator 132P. One ladder-type DAC also be time-divisionally used in the carrier wave generators 132N and 132P.

In FIG. 1, the pulse width modulator 131P outputs a first pulse Vp whose pulse width increases as the value of the input signal Vin increases in the positive direction, based on the input signal Vin−Vofs and the carrier wave C1P. The pulse width modulator 131N outputs a second pulse Vn whose pulse width increases as the value of the input signal Vin decreases in the negative direction, based on the input signal Vin+Vofs and the carrier wave C1N.

More specifically, the pulse width modulator 131P compares the input signal Vin−Vofs with the carrier wave C1P, and outputs the first pulse Vp which becomes ON (H level) during a period in which the input signal Vin−Vofs is larger than or equal to the carrier wave C1P. The pulse width modulator 131N compares the input signal Vin+Vofs with the carrier wave C1N, and outputs the second pulse Vn which becomes ON (H level) during a period in which the input signal Vin+Vofs is smaller than or equal to the carrier wave C1N.

Accordingly, the first pulse Vp is generated when the input signal Vin−Vofs is higher than or equal to the voltage −V2. The second pulse Vn is generated when the input signal Vin+Vofs is lower than or equal to the voltage +V2. Here, when the voltage of the input signal Vin−Vofs is −V2, the voltage of the input signal Vin+Vofs is Vin−Vofs+2Vofs=−V2+2Vofs=−V2+2(V1+V2)/2=V1. Also, when the voltage of the input signal Vin−Vofs is −V1, the voltage of the input signal Vin+Vofs is Vin−Vofs+2Vofs=−V1+2Vofs=−V1+2(V1+V2)/2=+V2. For this reason, when the absolute value of the input signal Vin is small and the input signal Vin−Vofs is in the value range from the voltage −V2 to the voltage −V1, the input signal Vin+Vofs is in the value range from the voltage +V1 to the voltage +V2. Then, the input signal Vin−Vofs in the value range from the voltage −V2 to the voltage −V1 crosses the carrier wave C1P in a portion where the voltage of the carrier wave C1P is in the range from the voltage −V2 to the voltage −V1 in each cycle of the carrier wave C1P, and the input signal Vin+Vofs in the value range from the voltage +V1 to the voltage +V2 crosses the carrier wave C1N in a portion where the voltage of the carrier wave C1N is in the range from the voltage +V1 to the voltage +V2 in each cycle of the carrier wave C1N. Thus, both the first pulse Vp and the second pulse Vn are generated.

In the period in which both the first pulse Vp and the second pulse Vn are generated, unless some sort of measure is taken using a general triangular wave having an amplitude of 2×V2 and a linear (constant) gradient, the inclination of the input/output characteristic of the class-D amplifier 1 becomes twice as large as the inclination in the other period, and the total harmonic distortion factor increases. Accordingly, in the present embodiment, the gradients (±S2) of the portion from the voltage −V2 to the voltage −V1 in each cycle of the carrier wave C1P are twice as large as the gradients (±S1) of the other portion (from the voltage −V1 to the voltage +V2), respectively. Also, the gradients (±S2) of the portion from the voltage +V1 to the voltage +V2 in each cycle of the carrier wave C1N are twice as large as the gradients (±S1) of the other portion (from the voltage −V2 to the voltage +V1), respectively. As a result, the inclination of the input/output characteristic of the class-D amplifier 1 becomes constant over the entire period, and an increase in the total harmonic distortion factor is suppressed.

Furthermore, in FIG. 2, the pulse width of the first pulse Vp in the case of no signal, that is to say, in the case where the input signal Vin is zero volts, is the time length between two intersections where the carrier wave C1P and the horizontal line corresponding to the voltage −Vofs intersect. Also, the pulse width of the second pulse Vn is the distance between two intersections of the carrier wave C1N and the horizontal line corresponding to the voltage +Vofs. In the present embodiment, the gradients (±S2) of the carrier waves C1P and C1N in the vicinity of these intersections are made larger than the gradients (±S1) of the other portions. As the positive offset voltage +Vofs approaches the positive peak voltage +V2 of the carrier wave C1N, the pulse width of the second pulse Vn at the time of no signal becomes narrower. Furthermore, as the negative offset voltage −Vofs approaches the positive peak voltage −V2 of the carrier wave C1P, the pulse width of the second pulse Vn at the time of no signal becomes narrower. Specifically, in the present embodiment, the duty ratio of each of the generated the first pulse Vp and the second pulse Vn is an appropriate value less than 50% in a state where a value of the input signal is zero. If a reduction in power consumption is desired, the duty ratio may be a value in the range of 5% to 30%.

An output stage 140 amplifies the first pulse Vp and the second pulse Vn, and outputs the amplified pulses as a first pulse P and a second pulse N from the terminals 151 and 152 to the LC filters 161 and 162. The first pulse Vp and the first pulse P have the same shape. The second pulse Vn and the second pulse N have the same shape. The positive-side input of the speaker SP is supplied with a positive-side voltage of an audio signal obtained as a result of the LC filter 161 removing a high-frequency component from the first pulse P. The negative-side input of the speaker SP is supplied with a negative-side voltage of the audio signal obtained as a result of the LC filter 162 removing the high-frequency component from the second pulse N. The feedback circuit 170 generates the above-described feedback signal Vf by removing the high-frequency component of the first pulse P and the second pulse N, and supplies the feedback signal Vf to the subtractor 111. As a result of negatively feeding back the feedback signal Vf, the audio signal supplied to the speaker SP has a voltage waveform having substantially the same shape as the input audio signal Ain.

Figure 4:
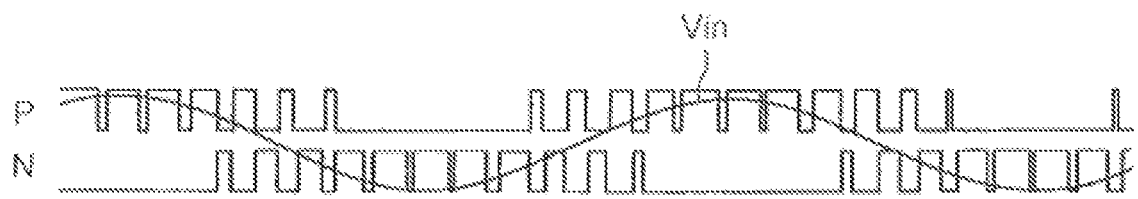
FIG. 4 is a waveform diagram illustrating an input signal of pulse width modulators of the class-D amplifier and a first pulse and a second pulse output from an output stage of the pulse width modulators.

Next, the operation of the present embodiment will be described. FIG. 4 shows the waveforms of the input signal Vin for the DC-offset adders 120P and 120N, and the first pulse P and the second pulse N output from the output stage 140. In FIG. 4, the horizontal axis represents time and the vertical axis represents voltage. In the example shown in FIG. 4, the input signal Vin is sinusoidal, and has zero volts, that is to say, no signal level, in the middle between its positive and negative peaks.

In FIG. 4, in order to facilitate understanding of the relationship between the input signal Vin and the pulse width of each of the first pulse P and the second pulse N, the first pulse P is superimposed on the positive half region of the waveform of the input signal Vin, and the second pulse N is superimposed on the negative half region of the input signal Vin. As shown in FIG. 4, the pulse width of the first pulse P increases as the value of the input signal Vin increases, and the pulse width of the second pulse N increases as the value of the input signal Vin decreases. The period in which the first pulse P is generated and the period in which the second pulse N is generated partially overlap on the time axis.

Figure 5:
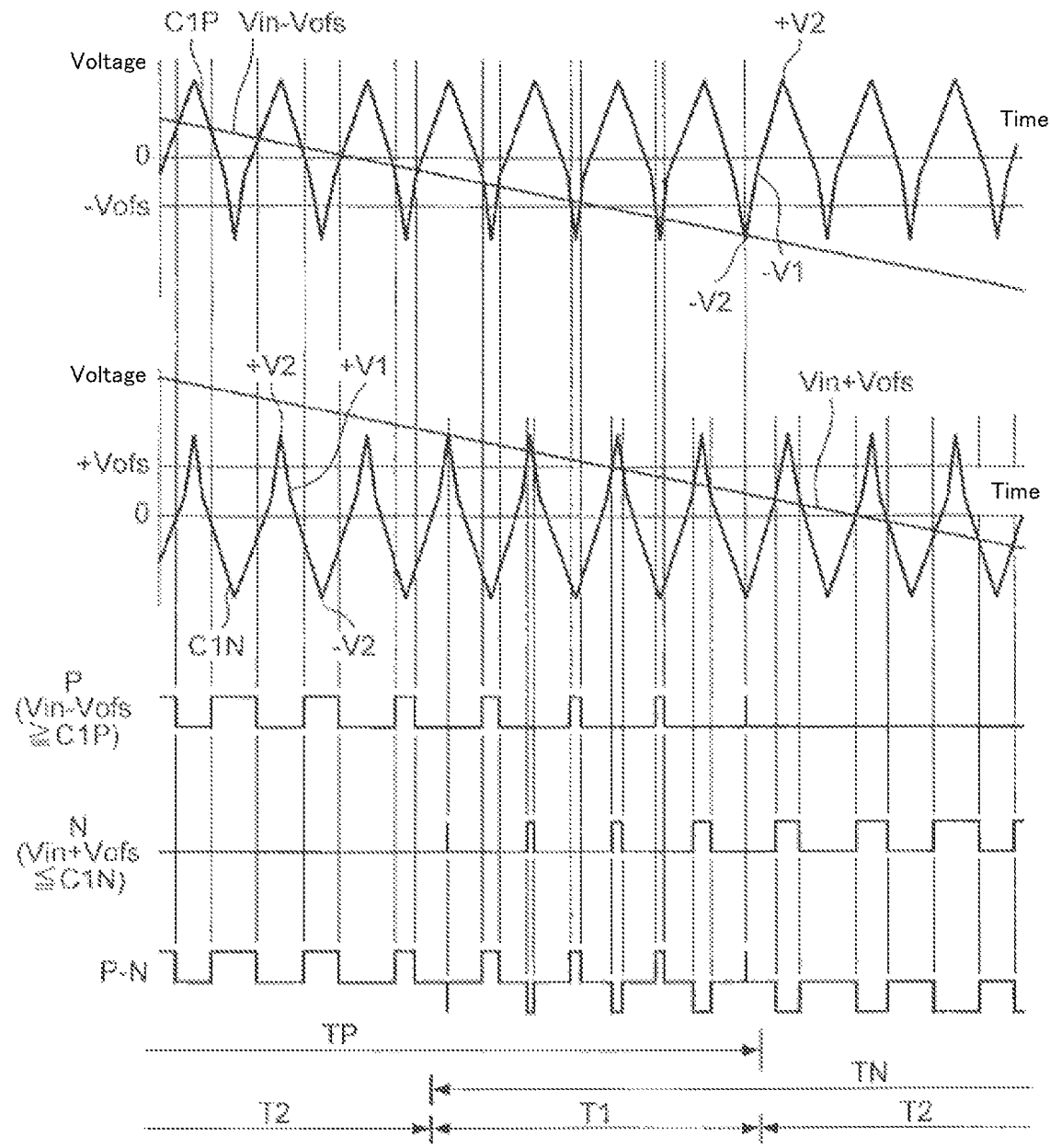
FIG. 5 is a waveform diagram illustrating an operation example of the class-D amplifier.

FIG. 5 shows the waveforms of the carrier wave C1P and the input signal Vin−Vofs supplied to the pulse width modulator 131P, the waveforms of the carrier wave C1N and the input signal Vin+Vofs supplied to the pulse width modulator 131N, and the waveforms of the first pulse P and the second pulse N output from the output stage 140 and the combined pulse P−N of the first pulse P and the second pulse N, when the value of the input signal Vin gradually decreases.

As shown in FIG. 5, in the period TP in which the input signal Vin−Vofs is higher than or equal to the voltage −V2 (that is to say, Vin≥−V1), the input signal Vin−Vofs crosses the carrier wave C1P, and the first pulse P is generated. Also, in the period TN in which the input signal Vin+Vofs is lower than or equal to the voltage +V2 (that is to say, Vin≤+V1), the input signal Vin+Vofs crosses the carrier wave C1N, and the second pulse N is generated.

The period TP ends when the input signal Vin−Vofs becomes lower than or equal to the voltage −V2 (that is to say, Vin<−V1). Also, the period TN starts when the input signal Vin+Vofs becomes lower than or equal to the voltage +V2 (that is to say, Vin>+V1). Here, the period T1 in which the period TP and the period TN overlap each other continues until the input signal Vin−Vofs becomes lower than or equal to the voltage −V2 after the input signal Vin+Vofs becomes lower than or equal to the voltage +V2. This period T1 is a period in which the class-D amplifier 1 is within the small signal region (that is to say, +V1≥Vin≥−V1), and both the first pulse P and the second pulse N are output. The period other than the period T1 is a period T2 in which only one of the first pulse P and the second pulse N is output.

In the period T1, the input signal Vin is within the first value range (+V1≥Vin≥−V1). When the input signal Vin is in the first value range, the input signal Vin−Vofs crosses the portion (gradients ±S2) from the voltage −V1 to the voltage −V2 in each cycle of the carrier wave C1P. Also, the input signal Vin+Vofs crosses the portion (gradients ±S2) from the voltage +V1 to the voltage +V2 in each cycle of the carrier wave C1N. In the present embodiment, when the input signal Vin is in the first value range, a portion having a steep gradient (a region having a gradient of +S2 or −S2) contributes to the change in the pulse width of the first pulse P and the second pulse N in each cycle of the carrier waves C1P and C1N, and when the input signal Vin is in the second value range, a portion having a gentle gradient (a region having a gradient of +S1 or −S1) contributes to the change in the pulse width of the first pulse P and the second pulse N in each cycle of the carrier waves C1P and C1N. In the present embodiment, when the input signal Vin is in the first value range, the gradients ±S2 of the portions of the carrier waves C1P and C1N in which the pulse width is changed are twice as large as the gradients ±S1 of the portions in which the pulse width is changed in the other second value range. That is to say, the change in the pulse width of the first pulse P and the second pulse N with respect to the change in the input signal Vin in the first value range is smaller than the change in the pulse width of the first pulse P and the second pulse N with respect to the change in the input signal Vin in the second value range, specifically, ½. Therefore, when the input signal Vin is in the first value range in which both the first pulse P and the second pulse N are output and when the input signal Vin is in the second value range in which only one of the first pulse P and the second pulse N is output, the total inclination of the input/output characteristic of the class-D amplifier 1 is the same.

Figure 6:
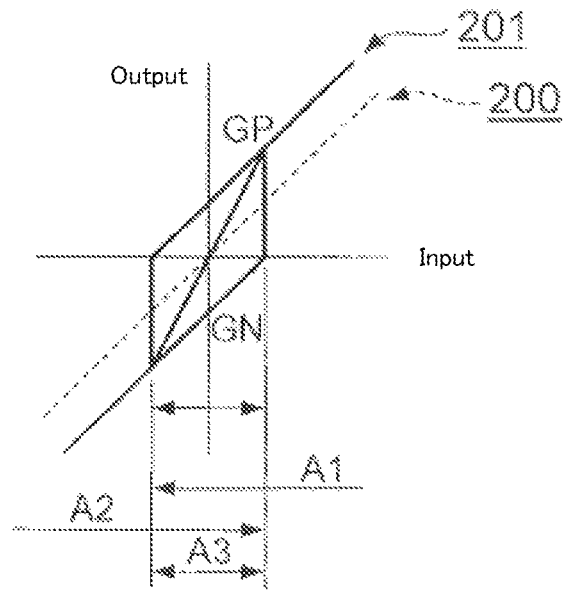
FIG. 6 is a diagram illustrating an input/output characteristic of a portion from a DC-offset adder to the output stage of the class-D amplifier.

FIG. 6 shows an input/output characteristic 200 of the portion from the DC-offset adders 120P and 120N to the output stage 140 in the present embodiment together with a comparative example 201. In FIG. 6, the horizontal axis represents input, that is to say, the voltage of the input signal Vin, and the vertical axis represents output, that is to say, the pulse width of the pulse P−N obtained by combining (subtracting) the first pulse P and the second pulse N (the difference between the pulse width of the pulse P and the pulse width of the pulse N). In the comparative example 201, it is assumed that the carrier waves C1P and C1N are general triangular waves. In FIG. 6, because the first pulse P is supplied to the positive side of the speaker SP, the pulse width of the pulse P is displayed in the positive polarity in the region on the positive side of the output so that the value increases as the pulse width increases. Also, because the second pulse N is supplied to the negative side of the speaker, the pulse width of the pulse N is displayed in the negative polarity in the region on the negative side of the output so that the value decreases as the pulse width increases.

In FIG. 6, in the first input range A1 in which the input signal Vin is larger than the negative predetermined voltage (−V1), the pulse width of the first pulse P increases with a constant inclination GP as the input signal Vin increases. In the second input range A2 in which the input signal Vin is smaller than the positive predetermined voltage (+V1), the pulse width of the second pulse N increases with a constant inclination GN as the input signal Vin decreases. In the third input range A3 where the first input range A1 and the second input range A2 overlap each other, both the first pulse P and the second pulse N are output.

In the comparative example 201, a general triangular wave is used as the carrier wave. For this reason, regardless of whether or not the input signal Vin is within the third input range A3, the pulse width of the first pulse P and the pulse width of the second pulse N change at the constant inclinations GP and GN corresponding to the gradients of the triangular wave. Then, in the third input range A3, both the first pulse P and the second pulse N are output. Therefore, when the carrier wave is a general triangular wave, the total inclination when the input signal Vin is in the third input range A3 is twice as large as the inclination GP and GN when the carrier wave is not a triangular wave. As a result, in the comparative example 201, as shown in FIG. 6, the input/output characteristic has a polygonal line shape, and the total harmonic distortion factor increases.

In contrast, in the present embodiment, the gradient of the carrier waves C1P and C1N for changing the pulse width when the input signal Vin is within the third input range A3 is twice as large as the gradient of the carrier waves for changing the pulse width when the input signal Vin is not within the third input range A3. For this reason, the input/output characteristic 200 in the present embodiment has a constant inclination throughout the entire input range, and the total harmonic distortion factor does not increase.

As described above, in the present embodiment, the value range of the carrier wave C1P related to the pulse width of the first pulse P in the small signal region is brought close to the negative peak −V2, and the value range of the carrier wave C1N is brough close to the positive peak +V2 by the offset voltage. As a result, the duty ratio of the first pulse P and the second pulse N in the small signal region becomes an appropriate value less than 50%, and power consumption is reduced. Further, in the present embodiment, the carrier waves C1P and C1N in the form of polygonal lines make the inclination of the change in the pulse width of each of the pulses P and N with respect to the change in the input signal Vin in the first value range half as large as the gradient of the change in the pulse width of the pulse P or N with respect to the change in the input signal Vin in the second value range. Therefore, the inclination of the input/output characteristic of the class-D amplifier becomes constant (linear) throughout the entire range of the input signal Vin, and the total harmonic distortion factor does not increase.

Second Embodiment

Figure 7:
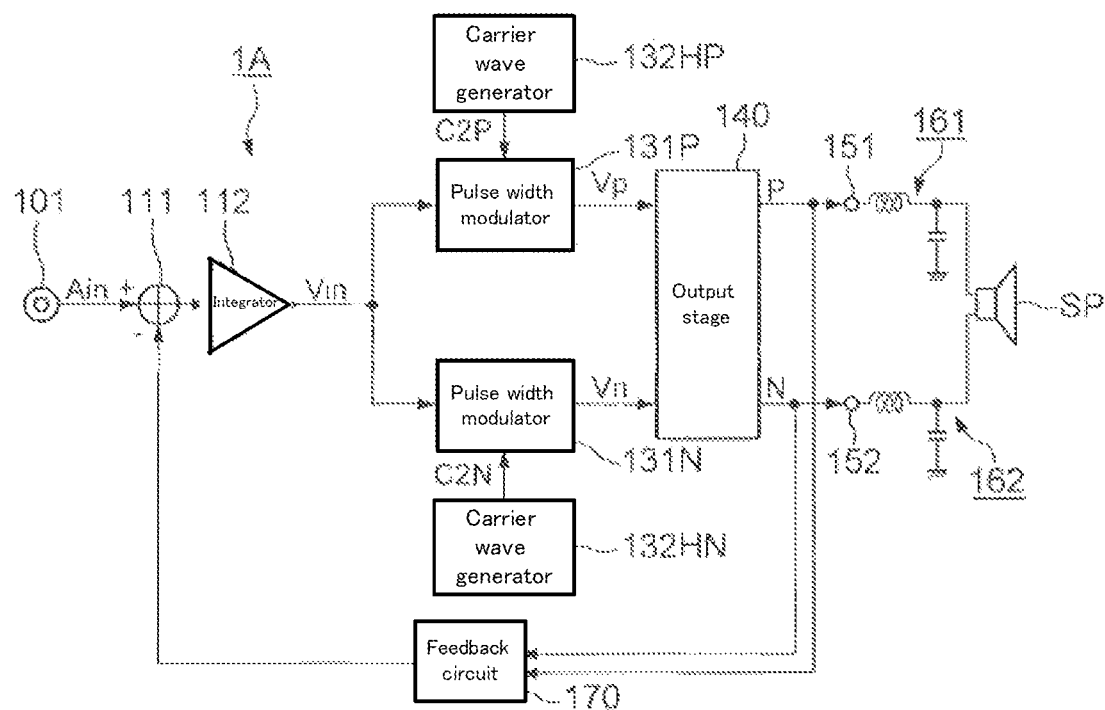
FIG. 7 is a block diagram illustrating a configuration of a class-D amplifier according to a second embodiment.

FIG. 7 is a block diagram of a class-D amplifier 1A according to a second embodiment. In FIG. 7, the same components as those in the above-described first embodiment (FIG. 1) are denoted by the same reference numerals, and the description thereof will be omitted.

In the present embodiment, the DC-offset adders 120P and 120N in the first embodiment are removed, and the first and second carrier wave generators 132P and 132N are replaced with first and second carrier wave generators 132HP and 132HN. The first and second carrier wave generators 132HP and 132HN respectively generate carrier waves C2P and C2N whose gradients continuously change, and respectively supply the carrier waves C2P and C2N to the pulse width modulators 131P and 131N. In the following, the first carrier wave generator 132HP is referred to as carrier wave generator 132HP and the second carrier wave generator 132HN is referred to as carrier wave generator 132HN.

Figure 8:
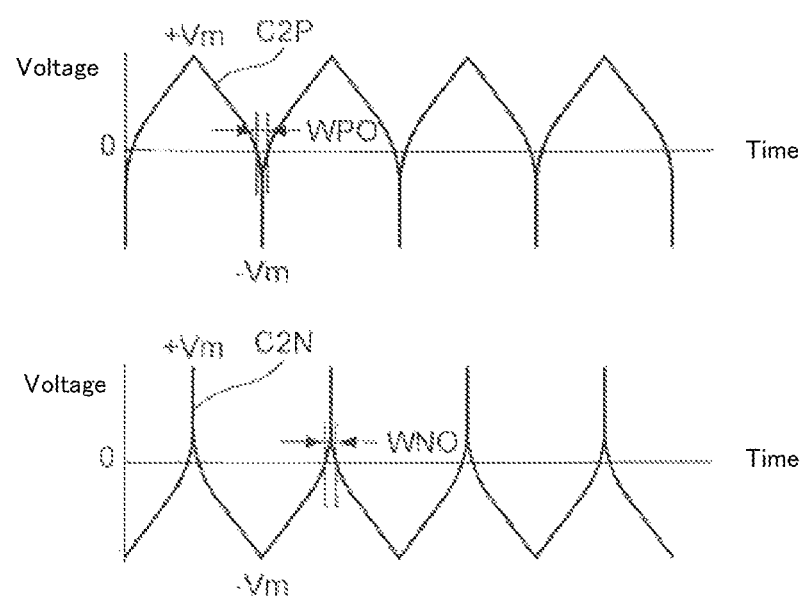
FIG. 8 is a waveform diagram illustrating waveforms of carrier waves in the class-D amplifier.
Figure 9:
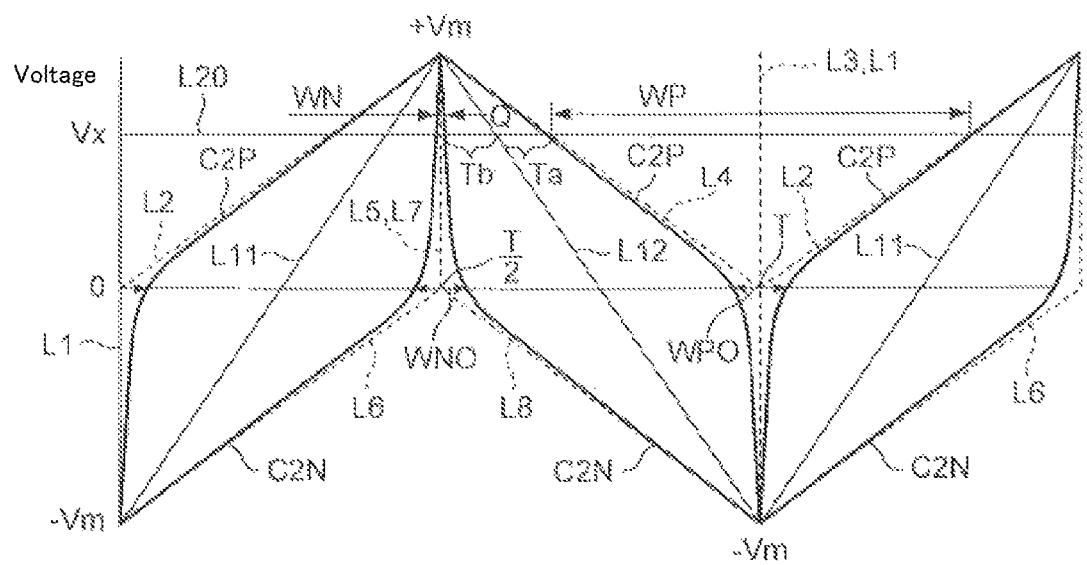
FIG. 9 is a waveform diagram illustrating the waveforms of the carrier waves in detail.

FIG. 8 shows waveforms of the carrier waves C2P and C2N. FIG. 9 shows waveforms of the carrier waves C2P and C2N in detail. The carrier wave C2P has, in each cycle T, a rising portion in which the waveform changes from a negative peak −Vm to a positive peak +Vm, and a falling portion in which the waveform changes from the positive peak +Vm to the negative peak −Vm. The time length of each of the rising portion and the falling portion in one cycle T of the carrier wave C2P is T/2. The rising portion and the falling portion are alternately repeated in the carrier wave CP2. In the rising portion, the gradient of the carrier wave C2P gradually becomes gentle. As shown in FIG. 9, in the rising portion, the carrier wave C2P is a hyperbola having a first asymptotic line L1 and a second asymptotic line L2 as asymptotic lines. The first asymptotic line L1 is a straight line orthogonal to the time axis at time=0 in a two-dimensional coordinate system including a horizontal axis indicating time and a vertical axis indicating voltage. The second asymptotic line L2 is a straight line having a positive gradient connecting the intersection of the first asymptotic line L1 and the time axis.

In the falling portion, the gradient of the carrier wave C2P gradually becomes steep. In the falling portion, the carrier wave C2P is a hyperbola having a third asymptotic line L3 and a fourth asymptotic line L4 as asymptotic lines. The third asymptotic line L3 is a straight line orthogonal to the time axis at time=T. The fourth asymptotic line L4 is a straight line having a negative gradient connecting the intersection of the third asymptotic line L3 and the time axis. The absolute values of the gradient of the second asymptotic line L2 and the gradient of the fourth asymptotic line L4 are each 2Vm/T.

The carrier wave C2N has, in each cycle T, a rising portion in which the waveform changes from a negative peak −Vm to a positive peak +Vm, and a falling portion in which the waveform changes from the positive peak +Vm to the negative peak −Vm. The time length of each of the rising portion and the falling portion in one cycle T of the carrier wave C2N is T/2. The rising portion and the falling portion are alternately repeated in the carrier wave C2N. In the rising portion, the gradient of the carrier wave C2N gradually becomes steep. As shown in FIG. 9, in the rising portion, the carrier wave C2N is a hyperbola having a fifth asymptotic line L5 and a sixth asymptotic line L6 as asymptotic lines. The fifth asymptotic line L5 is a straight line orthogonal to the time axis at time=T/2. The sixth asymptotic line L6 is a straight line having a positive gradient connecting the intersection of the fifth asymptotic line L5 and the time axis.

In the falling portion, the absolute value of the gradient of the carrier wave C2N gradually becomes gentle. In the falling portion, the carrier wave C2N is a hyperbola having a seventh asymptotic line L7 and an eighth asymptotic line L8 as asymptotic lines. The seventh asymptotic line L7 is the same as the fifth asymptotic line L5. The eighth asymptotic line L8 is a straight line having a negative gradient connecting the intersection of the seventh asymptotic line L7 and the time axis. The absolute values of the gradient of the sixth asymptotic line L6 and the gradient of the eighth asymptotic line L8 are each 2Vm/T.

Ideally, the hyperbola does not intersect the asymptotic line. However, in the present embodiment, the carrier waves C2P and C2N are adjusted so that two hyperbolas symmetrical in the time axis direction are connected to each other at the same negative peak −Vm. Furthermore, the carrier waves C2P and C2N are adjusted so that two hyperbolas symmetrical in the time axis direction are connected to each other at the same positive peak +Vm.

The carrier waves C2P and C2N in the present embodiment have the following characteristics. In FIG. 9, a straight line L11 connecting the point (0, −Vm) and the point (T/2, +Vm), and a straight line L12 connecting the point (T/2, +Vm) and the point (T, −Vm) are shown. In the rising portion (from 0 to T/2), each point of a voltage Vx on the carrier waves C2P and C2N is at an equal time point on either side of the point of the voltage Vx on the straight line L11. In the falling portion (from T/2 to T), each point of the voltage Vx on the carrier waves C2P and C2N is at an equal time point on either side of the point of the voltage Vx on the straight line L12.

Accordingly, the following matters are established. The difference between the first time difference WP (the pulse width of the first pulse) and the second time difference WN (the pulse width of the second pulse) changes linearly in accordance with the input voltage Vx (specifically, the difference changes in the same manner as the straight lines L11 and L12). The first time difference WP is the time difference between the two intersections with the voltage Vx (straight line L20) of the carrier wave C2P in the falling portion and the rising portion. The second time difference WN is the time difference between the two intersections with the voltage Vx (straight line L20) of the carrier wave C2N in the falling portion and the rising portion.

Hereinafter, this matter will be proved. In FIG. 9, the intersection of the straight line L20 and the straight line L12 is denoted by Q. On the straight line L20, the time difference Ta between the intersection of the straight line L20 and the carrier wave C2P in the falling portion, and the intersection Q can be expressed by the following equation.

$$Ta = ((T/2)/(2Vm))(Vm + Vx) - (WP/2) \quad (1)$$
$$= (T/(4Vm))(Vm - Vx) - (WP/2)$$

Furthermore, on the straight line L20, the time difference Tb between the intersection of the straight line L20 and the carrier wave C2N in the falling portion, and the intersection Q can be expressed by the following equation.

$$Tb = ((T/2)/(2Vm))(Vm - Vx) - (WN/2) \quad (2)$$
$$= (T/(4Vm))(Vm - Vx) - (WN/2)$$

When Ta=Tb, the following equation is established from the equations (1) and (2).

$$(T/(4Vm))(Vm-Vx)-(WP/2)=(T/(4Vm))(Vm-Vx)-(WN/2): \quad (3)$$

The following equation is obtained by rearranging the equation (3).

$$WP-WN=(T/Vm)Vx: \quad (4)$$

Accordingly, the difference between the first time difference WP (the pulse width of the first pulse) and the second time difference WN (the pulse width of the second pulse) changes linearly in accordance with the input voltage Vx.

The functions of the other units are the same as those of the first embodiment.

Next, operations of the present embodiment will be described. In FIG. 7, the pulse width modulator 131P compares the input signal Vin with the carrier wave C2P, and outputs the first pulse Vp which becomes ON (H level) in a period in which the input signal Vin is higher than or equal to the carrier wave C2P. The pulse width modulator 131N compares the input signal Vin with the carrier wave C2N, and outputs the second pulse Vn which becomes ON (H level) in a period in which the input signal Vin is lower than or equal to the carrier wave C2N. Accordingly, the pulse width of the first pulse Vp becomes the first time difference WP shown in FIG. 9, and the pulse width of the second pulse Vn becomes the second time difference WN.

In the present embodiment, the first pulse P and the second pulse N that are output from the output stage 140 change as follows. First, as the input signal Vin increases in the positive direction, the pulse width of the first pulse P rapidly increases, and the pulse width of the second pulse N gradually decreases. Also, as the input signal Vin decreases in the negative direction, the pulse width of the second pulse N rapidly increases, and the pulse width of the first pulse P gradually decreases. Then, the difference between the pulse width WP of the first pulse P and the pulse width WN of the second pulse N changes linearly in accordance with the input signal Vin.

FIG. 9 shows the pulse width WP0 of the first pulse Vp and the pulse width WN0 of the second pulse Vn when there is no signal, that is to say, when the input signal Vin is zero volts. In the present embodiment, because the carrier waves C1P and C1N have a hyperbolic shape, the pulse widths WP0 and WN0 at the time of no signal are sufficiently short. In this example, the duty ratio of the first pulse Vp and the second pulse Vn at the time of no signal is about 10%. Accordingly, the power consumption at the time of no signal or the power consumption in the small signal region including the non-signal state is reduced.

Figure 10:
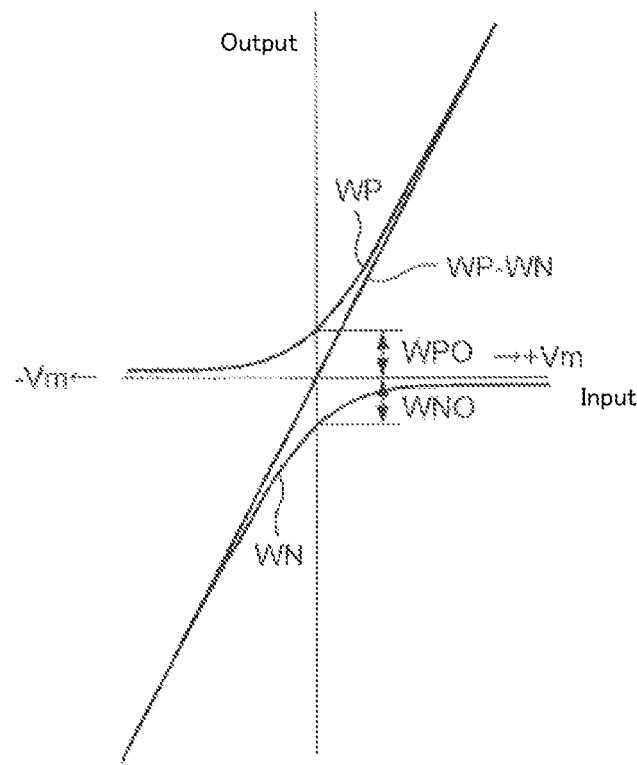
FIG. 10 is a diagram illustrating an input/output characteristic of the class-D amplifier.

FIG. 10 shows the input/output characteristic of the portions from the pulse width modulators 131P and 131N to the output stage 140 in the present embodiment. In FIG. 10, the horizontal axis represents input, that is to say, the voltage of the input signal Vin. The vertical axis represents output, that is to say, the pulse width WP−WN (the difference value obtained by subtracting the pulse width WN from the pulse width WP) of the pulse P−N obtained by combining (subtracting) the pulse widths WN of the first pulse P and the second pulse N. Furthermore, the pulse width WP of the first pulse P is displayed with positive polarity, and the pulse width WN of the second pulse N is displayed with negative polarity.

Here, the relationship between FIG. 9 and FIG. 10 will be described. In FIG. 9, the pulse width WP of the first pulse P is a time difference between two intersections where the falling portion from the voltage +Vm to the voltage −Vm in the carrier wave C2P and the rising portion from the voltage −Vm to the voltage +Vm in the carrier wave C2P intersect with the input voltage Vx (straight line L20).

In the input/output characteristic of the present embodiment, as the input signal Vin increases from the negative side to the positive side, the inclination of the increase amount of the value of the pulse width of the first pulse P with respect to the increase amount of the input signal Vin gradually increases. Specifically, when the voltage Vx of the input signal Vin increases from the voltage −Vm to the voltage +Vm, the value of the pulse width WP of the first pulse P gradually increases from the vicinity of zero along the hyperbolic waveform of the carrier wave C2P (the pulse width increases). The inclination of the change in the pulse width WP with respect to the change in the input signal Vin gradually approaches a predetermined value. This predetermined value is proportional to the inverse of the gradient of the asymptotic lines L2 and L4.

When the input signal Vin gradually increases from the voltage −Vm to the voltage +Vm in FIG. 10, the inclination of the increase in the value of the pulse width WP with respect to the increase in the input signal Vin (inclination of the input/output characteristic) increases from a positive value close to zero and approaches a predetermined value (inclination of the straight line WP−WN in FIG. 10).

In FIG. 9, the pulse width WN of the second pulse N is a time difference between the two intersections where the rising portion from the voltage −Vm to the voltage +Vm in the carrier wave C2N and the falling portion from the voltage +Vm to the voltage −Vm in the carrier wave C2N intersect with the input voltage Vx (straight line L20).

In the input/output characteristic of the present embodiment, as the input signal Vin decreases from the positive side to the negative side, the inclination of the decrease amount of the value of the pulse width of the second pulse N with respect to the decrease amount of the input signal Vin gradually increases. It should be noted that, in the negative polarity display, as the value of the pulse width decreases, the pulse width increases. Specifically, when the input signal Vin decreases from the voltage +Vm to the voltage −Vm, the value of the pulse width WN of the second pulse N gradually decreases (the pulse width increases) from the vicinity of zero along the hyperbolic waveform of the carrier wave C2N, and the inclination of the decrease of the value of the pulse width WN with respect to the decrease of the input signal Vin gradually approaches a predetermined value. This predetermined value is proportional to the inverse of the gradient of the asymptotic lines L6 and L8.

When the input signal Vin gradually decreases from the voltage +Vm to the voltage −Vm in FIG. 10, the inclination of the decrease in the value of the pulse width WN with respect to the decrease in the input signal Vin (inclination of the input/output characteristic) gradually increases from a positive value close to zero and gradually approaches a predetermined value (inclination of the straight line WP−WN in FIG. 10).

In the present embodiment, as shown in FIG. 10, the difference between the pulse width WP of the first pulse P and the pulse width WN of the second pulse N changes linearly in accordance with the change in the voltage Vx of the input signal Vin. As described above, according to the present embodiment, the inclination of the input/output characteristic of the class-D amplifier 1A can be made constant throughout the entire region of the input signal Vin. Therefore, according to the present embodiment, it is possible to reduce the power consumption in the small signal region, while avoiding an increase in the total harmonic distortion factor.

Other Embodiments

While the embodiments have been described above, other embodiments are conceivable. Other embodiments are as follows, for example.

(1) The disclosure can be applied to a wide range of class-D amplifiers such as a class-D amplifier with a high output exceeding 100 W and a class-D amplifier with a low output installed in a cellular phone or the like. For a class-D amplifier with a low output, LC filters 161 and 162 may be omitted.

(2) In the above first embodiment, the pulse width modulators 131P and 131N generate pulses by comparing a signal obtained by adding an offset voltage to an input signal with a carrier wave. Alternatively, a pulse also be generated by comparing a signal obtained by adding an offset voltage and a carrier wave to an input signal with a threshold value.

(3) Although a non-linear triangular wave is used as a carrier wave in the first embodiment, a non-linear sawtooth wave also be used. In this case, in each cycle of the sawtooth wave, the gradient of a portion that falls or rises obliquely with respect to the time axis is changed in a stepwise manner.

(4) In the above first embodiment, by making the carrier wave to have a waveform of the polygonal line shape, the gradient of the change in the pulse width with respect to the change in the input signal Vin in the period T1 is set to ½ of the gradient of the change in the pulse width with respect to the change in the input signal Vin in the period T2. However, it is not necessary to make the gradient of the change in the pulse width exactly ½. For example, if the gradient of the change in the pulse width with respect to the change in the input signal Vin in the period T1 is made smaller than the gradient of the change in the pulse width with respect to the change in the input signal Vin in the period T2 and the difference between the inclinations of the input/output characteristic in the period T1 and the period T2 is made small, it is possible to avoid an increase in the total harmonic distortion factor in accordance with the decrease.

Figure 11:
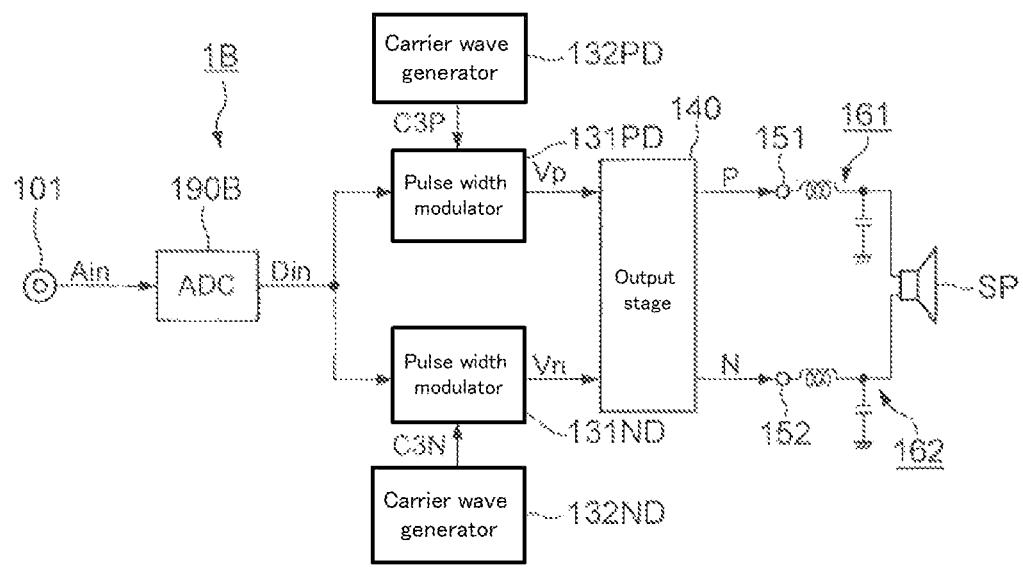
FIG. 11 is a block diagram illustrating a configuration of a class-D amplifier according to another embodiment.

(5) FIG. 11 is a block diagram illustrating a configuration of a class-D amplifier 1B according to another embodiment. In FIG. 11, the same components as those in the first embodiment (FIG. 1) are denoted by the same reference numerals, and the description thereof will be omitted.

The class-D amplifier 1B is provided with an ADC (Analogue Digital Converter) 190B that A/D converts an input audio signal Ain at a predetermined sampling frequency Fs (for example, 50 kHz). Also, the class-D amplifier 1B does not include components corresponding to the subtractor 111, the integrator 112, and the feedback circuit 170 of the first embodiment (FIG. 1). Furthermore, in the class-D amplifier 1B, the pulse width modulators 131P and the 131N and the carrier wave generators 132P and the 132N of the first embodiment (FIG. 1) are replaced with pulse width modulators 131PD and 131ND and carrier wave generators 132PD and 132ND. The pulse width modulators 131PD and 131ND and the carrier wave generators 132PD and 132ND operate at a sufficiently high clock (for example, a clock higher than or equal to 10 MHz). The output stage 140 is similar to that of the first embodiment.

In the class-D amplifier 1B, the pulse width modulators 131PD and 131ND, the carrier wave generators 132PD and 132ND, and the output stage 140 also be digital circuits, or also be functions achieved by a processor such as a DSP (Digital Signal Processor) executing a program.

In FIG. 11, the pulse width modulator 131PD generates a first pulse Vp by comparing a signal obtained by adding an offset voltage +Vofs to a carrier wave C3P corresponding to the carrier wave C1P of the first embodiment (FIG. 1) with an input signal Din supplied from the ADC 190B. Also, the pulse width modulator 131ND generates a second pulse Vn by comparing a signal obtained by adding an offset voltage −Vofs to a carrier wave C3N corresponding to the carrier wave C1N of the first embodiment (FIG. 1) with the input signal Din supplied from the ADC 190B. The operations of other units are the same as those of the above embodiments. In the present embodiment, the same effect as in the above first embodiment can be obtained with a simple configuration in which an integrator and the like are omitted.

The embodiment shown in FIG. 11 also be applied to the above second embodiment (FIG. 7). In this case, the pulse width modulator 131PD generates the first pulse Vp by comparing the carrier wave C3P corresponding to the carrier wave C2P of the second embodiment (FIG. 7) with the input signal Din supplied from the ADC 190B. Also, the pulse width modulator 131ND generates the second pulse Vn by comparing the carrier wave C3N corresponding to the carrier wave C2N of the second embodiment (FIG. 7) with the input signal Din supplied from the ADC 190B. In the present embodiment, the same effect as in the above second embodiment can be obtained with a simple configuration in which an integrator and the like are omitted.

Figure 12:
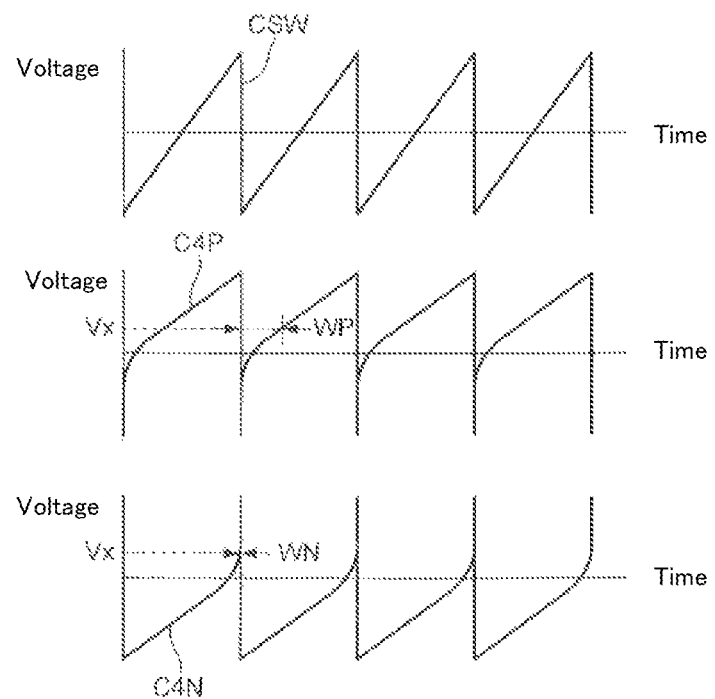
FIG. 12 is a waveform diagram illustrating carrier waves in the other embodiment.

(6) FIG. 12 shows waveforms of a first carrier wave C4P and a second carrier wave C4N used in the other embodiments together with a waveform of a sawtooth wave CSW as a comparative example. In the above second embodiment, the gradients of both the rising portion and the falling portion of the carrier wave are continuously changed. In contrast, in the present embodiment, the first carrier wave C4P and the second carrier wave C4N in which only the gradient of the rising portion of the sawtooth wave CSW is continuously changed are used.

In the present embodiment, the first carrier wave C4P has a hyperbola-shaped portion that rises with a gentle gradient and a portion that falls vertically, and the second carrier wave C4N has a hyperbola-shaped portion that rises with a steep gradient and a portion that falls vertically. Furthermore, in the present embodiment, the first pulse P is generated during a period in which the voltage Vx of the input signal Vin is higher than or equal to the first carrier wave C4P, and the second pulse N is generated during a period in which the voltage Vx of the input signal Vin is lower than or equal to the second carrier wave C4N. The difference between the pulse width of the first pulse P and the pulse width of the second pulse N changes linearly in accordance with the voltage Vx. Therefore, also in the present embodiment, the same effect as that of the second embodiment can be obtained.

The invention claimed is:

1. A class-D amplifier comprising:
   first and second carrier wave generators configured to respectively generate a first carrier wave and a second carrier wave, each of the generated first and second carrier waves being a periodic signal including a rising portion and a falling portion; and
   first and second pulse width modulators configured to respectively generate:
   a first pulse whose pulse width changes in accordance with an input signal, based on the input signal and the generated first carrier wave; and a second pulse whose pulse width changes in accordance with the input signal, based on the input signal and the generated second carrier wave, wherein each of the generated first and second carrier waves includes a non-linear gradient in at least one of the rising portion or the falling portion, and wherein due to the non-linear gradient in each of the generated first and second carrier waves:
   a duty ratio of each of the generated first and second pulses is less than 50% in a state where a value of the input signal is zero; and
   a difference between a pulse width of the first pulse and the pulse width of the second pulse linearly changes according to the input signal.

2. The class-D amplifier according to claim 1 wherein, due to the non-linear gradient in each of the generated first and second carrier waves:
   a change in the pulse width of the generated first pulse with respect to a change in the value of the input signal increases as the value of the input signal increases; and
   a change in the pulse width of the generated second pulse with respect to the change in the value of the input signal decreases as the value of the input signal decreases.

3. The class-D amplifier according to claim 1, wherein:
   in each cycle of the generated first carrier wave, the gradient is gentler in a first portion corresponding to the input signal where the value thereof is at a first value than the gradient in a second portion corresponding to the input signal where the value thereof is at a second value, which is smaller than the first value, and
   in each cycle of the generated second carrier wave, the gradient is steeper in the first portion than the gradient in the second portion.

4. The class-D amplifier according to claim 3, wherein in each cycle of the generated first and second carrier waves, the gradient varies in a third portion corresponding to the input signal where the value thereof is changing between positive and negative, the third portion is disposed between the first and second portions.

5. The class-D amplifier according to claim 1, wherein:
   in each cycle of the generated first carrier wave, the gradient is gentler in a first portion corresponding to the input signal where the value thereof is within a first value range than the gradient in a second portion corresponding to the input signal where the value thereof is within a second value range, which is smaller than the first value range, and
   in each cycle of the generated second carrier wave, the gradient is steeper in the first portion than the gradient in the second portion.

6. The class-D amplifier according to claim 1, wherein the gradient of each of the generated first and second carrier waves changes stepwise in each cycle.

7. The class-D amplifier according to claim 1, wherein the gradient of each of the generated first and second carrier waves continuously changes in each cycle.

8. The class-D amplifier according to claim 2, wherein the gradient of each of the generated first and second carrier wave changes stepwise in each cycle.

9. The class-D amplifier according to claim 2, wherein the gradient of each of the generated first and second carrier waves continuously changes in each cycle.

10. The class-D amplifier according to claim 7, wherein:
    the generated first carrier wave includes at least one of:
    a first rising portion where as a waveform rises the gradient thereof becomes steeper, or
    a first falling portion where as a waveform falls the gradient thereof becomes gentler, and
    the generated second carrier wave includes at least one of:
    a second rising portion where as a waveform rises the gradient thereof becomes steeper, or
    a second falling portion where as a waveform falls the gradient thereof becomes gentler.

11. The class-D amplifier according to claim 7, wherein each of the generated first and second carrier waves includes at least a part of a hyperbolic waveform including:
    a first asymptotic line orthogonal to a time axis; and
    a second asymptotic line with a predetermined gradient passing through an intersection of the time axis and the first asymptotic line.

12. The class-D amplifier according to claim 8, wherein each of the generated first and second carrier waves includes at least a part of a hyperbolic waveform including:
    a first asymptotic line orthogonal to a time axis; and a second asymptotic line with a predetermined gradient passing through an intersection of the time axis and the first asymptotic line.

13. A class-D amplifier comprising:
a first modulator configured to generate a first pulse whose pulse width increases as a value of an input signal increases; and
a second modulator configured to generate a second pulse whose pulse width increases as the value of the input signal decreases,
wherein a duty ratio of each of the generated first and second pulses is less than 50% in a state where the value of the input signal is zero, and
wherein a difference between the pulse width of the generated first pulse and the pulse width of the generated second pulse changes linearly according to the input signal, and
wherein, as the value of the input signal increases, a change in the pulse width of the generated first pulse with respect to a change in the value of the input signal increases, and
wherein as the value of the input signal decreases, a change in the pulse width of the generated second pulse with respect to the change in the value of the input signal decreases.

14. The class-D amplifier according to claim 13, wherein:
in a state where the value of the input signal is within a first value range where both the first pulse and the second pulse are output, the pulse widths of the generated first and second pulses each change at a first ratio in accordance with the change in the value of the input signal, and
in a state where the value of the input signal is within a second value range where only one of the generated first or second pulse is output, the pulse width of the respective generated first or second pulse changes at a second ratio that is half of the first ratio in accordance with the change in the input signal.

15. The class-D amplifier according to claim 13, wherein, in an entire change range of the value of the input signal:
the change in the pulse width of the first pulse increases as the value of the input signal increases; and
the change in the pulse width of the second pulse decreases as the value of the input signal decreases.

16. A method of generating a carrier wave signal in a class-D amplifier, the method comprising:
generating a first carrier wave and a second carrier wave, each of the generated first and second carrier waves being a periodic signal including a rising portion and a falling portion; and
generating a first pulse whose pulse width changes in accordance with an input signal, based on the input signal and the generated first carrier wave; and
generating a second pulse whose pulse width changes in accordance with the input signal, based on the input signal and the generated second carrier wave, wherein each of the generated first and second carrier waves includes a non-linear gradient in at least one of the rising portion or the falling portion, and wherein due to the non-linear gradient in each of the generated first and second carrier waves:
a duty ratio of each of the generated first and second pulses is less than 50% in a state where a value of the input signal is zero; and
a difference between a pulse width of the first pulse and the pulse width of the second pulse linearly changes according to the input signal.

* * * * *